FOUR LAYER SEMICONDUCTOR DEVICE

Filed March 14, 1963

INVENTOR.
KURT HUBNER
BY
Flehr and Swain
ATTORNEYS 3,277,352

FOUR LAYER SEMICONDUCTOR DEVICE

Kurt Hubner, Palo Alto, Calif., assignor to International Telephone and Telegraph Corporation, New York, N.Y., a corporation of Maryland Filed Mar. 14, 1963, Ser. No. 265,099
3 Claims. (Cl. 317—234)

This invention relates generally to a four layer semiconductor device and more particularly to a four layer semiconductor switching device.

It is known that surface defects and contamination lowers the reverse breakdown voltage of a junction in semiconductive devices. Further, since the contamination cannot be controlled, the reverse breakdown voltage may vary from device to device and in the same device at different times. It is important that there be a stable high breakdown voltage in four layer switching devices.

In copending application Serial No. 97,777 (now abandoned), there are described devices which include means for minimizing surface effects. Generally, one of the regions contiguous with the center junction has a lower concentration of unbalanced chemical charges in the space charge region, at breakdown for the center junction, in a portion of the device which surrounds the central portion of the device. This is the so-called "guard ring" which assures operation of the device in the portion removed from the surface.

However, if this so-called "guard ring" fails for some reason, the voltage applied across the device may cause current to flow along the surface across the exposed junction. This part of the device will then determine the reverse breakdown voltage of the junction.

When four layer devices are connected in series in high voltage, high power switching circuits, such as pulse modulator circuits, the high voltage, such as the charging voltage, applied to the series string may appear mostly across one and initiate breakdown of the series string. To overcome this, resistive voltage dividing networks are employed to assure that a predetermined portion of the voltage is applied to each of the devices. However, such circuits dissipate substantial power since the resistive network must draw a current substantially higher than the leakage current of the devices. Partitioning networks including capacitance are used to permit sequential turn-on of the devices in response to a small triggering pulse. When these capacitors are recharged following triggering, care must be taken not to exceed the breakdown voltage of any one device of the series string. This problem is particularly acute when rapid charging is desired.

It is a general object of the present invention to provide an improved four layer semiconductor switching device.

It is another object of the present invention to provide a "guard ring" four layer semiconductor switching device in which the effects of surface breakdown are further minimized.

It is still another object of the present invention to provide a four layer switching device in which the alpha of at least one of the transistor pairs defined by the four layers is smaller adjacent the surfaces of the device than in the center of the device.

It is still another object of the present invention to provide a four layer semiconductor switching device in which the emitter layer of the transistor pair having the highest overall alpha has a distributed emitter short so as to require a predetermined finite current flow before the device switches to its low impedance state.

The foregoing and other objects of the invention will be more clearly understood from the following description when taken in conjunction with the accompanying drawing.

Referring to the drawing:

FIGURES 4A–4K show one method of manufacturing a semiconductor device in accordance with the invention;

Figure 1:
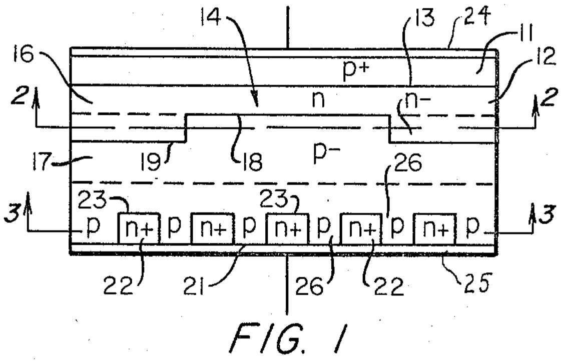
FIGURE 1 is a sectional elevational view of a device in accordance with the invention.
Figures 2, 3, 4, 6:
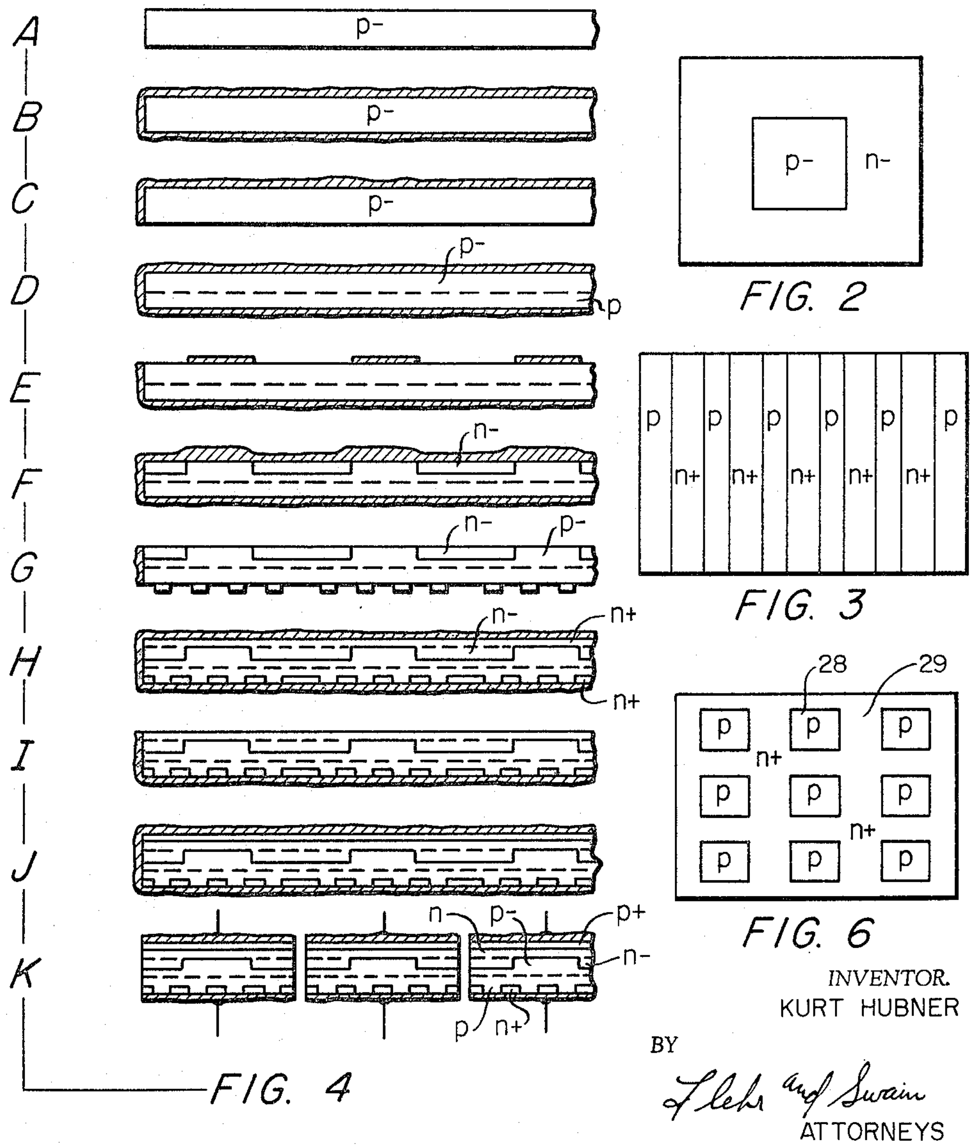
FIGURE 2 is a sectional view taken along the line 2—2 of FIGURE 1.
FIGURE 3 is a sectional view taken along the line 3—3 of FIGURE 1.
FIGURE 6 shows another device incorporating the invention.

Referring to FIGURES 1, 2 and 3, there is shown a semiconductor device which includes, in essence, four contiguous regions of semiconductive material with the contiguous regions being of opposite conductivity type to form, in essence, three rectifying junctions. However, one of the "regions" of semiconductive material is a distributed region which may be in the form of a plurality of separated insert bars or interconnected bars which form a web. The portions of the p-type region which extend to the same surface as the inset region are in ohmic contact with the associated terminal. In operation in the "on" state, the outer junctions operate as emitter-base junctions and the center junction as a common avalanche junction. The device can be regarded as a p-n-p and an n-p-n transistor, each having emitter, base and collector regions with a common collector junction.

The device shown includes a p+ region 11 and n-type region 12 contiguous therewith to form a first rectifying junction 13. The n-type region 12 includes a central portion 14 and a thicker outer surrounding portion or ring 16. The surrounding portion 16 has a lower impurity concentration (n—) region. A low impurity concentration p-type region 17 (p—) forms rectifying junction 18, 19 with the central portion 14 and surrounding portion 16 of the n-type region 12. The p-type region 17 has a first low impurity concentration layer (p—) adjacent the center junction and a higher impurity concentration layer (p) which extends to the face 21 of the device.

Inset into the p-type layer is a plurality of n-type regions 22 in the form of strips which form the rectifying junctions 23. Ohmic contacts 24 and 25 are formed with the outer faces of the device. The ohmic contact 25 extends over the entire face 21. The ribs of the p-type region which extend to the surface are ohmically connected to contact 25. The contact 25 provides a distributed short across the n-p junction between the ribs and the inset steps. The distributed short is selected since shorting only one emitter junction would cause injection to occur in the emitter region farthest away from the short due to the additional lateral voltage drop in the base region 17. This would lead to non-uniform turn-on.

The emitter and emitter short are selected so that the spreading time for turn-on, either by lateral diffusion of minority carriers or by RC type spreading over half the width of one emitter bar, is comparable or shorter than the minority carrier transit time through the base. This ensures that turn-on initiates over that portion of the base which is covered by the emitter inset regions. Thus, if the emitter stripes occupy fifty percent of the total area, turn-on will occur over fifty percent in one transit time. In other words, the distributed shorted emitter regions are arranged so that unshorted regions are at least in one dimension equal to or smaller than the lateral spreading distance by minority carrier diffusion or RC type spreading in one minority carrier transit time through the base.

The center junction includes an inner portion 18 having a relatively high concentration of unbalanced chemical charges on at least one side of the junction and a surrounding portion 19 which has a low concentration of unbalanced chemical charges, the latter portion extending to the surfaces of the device. With the concentration of unbalanced chemical charges within the space charge region of the junction 18, 19 at breakdown voltage on at least one side of the junction selected to be less at the surrounding portion 19 than in the inner portion 18, the breakdown voltage at the outer surrounding portion 19 will be higher and the junction portion 18 will control the breakdown voltage. This is the so-called "guard ring."

The use of the thick (n—) ring provides an additional advantage. It provides a device in which the alpha of at least one of the transistors is smaller in the outer region or portion than the inner region or portion. More particularly, for a given uniform current density across the entire device, the sum of the alpha's for the inner region is higher than that for the outer region. Since the condition for switching is that the sum of the two alpha's be equal to or greater than one, the inner region will switch before the switching condition for the outer region is reached. Turn-on will, therefore, take place in the inner region. It is seen that this effect is in addition to the "guard ring" effect discussed above and is added insurance that the device will breakdown in the inner portion at lower voltages than the outer portion.

The foregoing configuration for the guard ring has the additional advantage that if the guard ring effect described above fails for any reason, the applied voltage across the device will cause current to flow through a localized spot at the surface of the device. The minority carriers injected into the base by the emitter regions 11 and 22 will partially diffuse to the reverse biased junction 18. Due to the higher alpha in this region, turn-on will occur there rather than at the spot at the surface which first starts to draw current. This mechanism, therefore, assures turn-on in the central portion of the device even if breakdown is initiated at the surface of the device.

Figure 5:
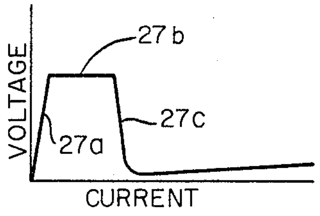
FIGURE 5 shows a curve of the voltage-current characteristics of a device constructed in accordance with the invention.

When premature surface breakdown occurs as described above, the switching voltage is determined by the premature breakdown voltage of the bad spot at the exposed surface. A further safeguard against turn-on due to small currents flowing at the surface can be obtained by substantially increasing the current necessary for switching. This is indicated by the flat top portion of the voltage-current curve of FIGURE 5.

The flat top characteristic can be achieved by partially shorting the emitter of the three layer structure which has the higher overall alpha. The practical effect is that as long as a bad spot draws less than the switching current, the device will stay in the "off" state. This greatly enhances the chance of designing an avalanche voltage at the inner region which is determinative of the switching voltage and not by leakage or spurious currents.

When operating at lower currents, the current flow is through the portions 26 of the p-type (base) region of the lower transistor. As the current increases, the voltage drop in these portions increases due to the voltage drop caused by the current flow in these portions. When the voltage drop along these portions exceeds the injection voltage of the segmented emitter junction 23, the emitter region 22 will inject into the adjacent base region 17 and the device will turn on instantaneously and substantially uniformly throughout. This effect is clearly seen by studying the voltage-current characteristic shown in FIGURE 5. As the voltage is increased, the current through the device increases at first very slowly as shown by the portion 27*a* of the curve. Then, with a small increase in voltage, the current increases rapidly as shown by the portion of the curve 27*b*. Finally, the current is sufficient to cause injection and the device switches as indicated by the negative resistance portion 27*c* of the curve. It is noted that substantial current must flow before the breakdown condition is attained. It is further noted that the device is now switched essentially by the current rather than by the voltage as is true of conventional four layer, two terminal switching devices.

Referring to FIGURE 6, there is shown schematically a structure similar to that of FIGURE 1 but which includes a distributed short which is in the form of p-type plugs 28 rather than ribs. This then forms a distributed emitter having a plurality of bars 29 forming a web having a distributed short. Operation is as previously described.

A semiconductor device of the type as shown in FIGURES 1, 2 and 3 may be manufactured by the method schematically illustrated by the flow chart of FIGURE 4. A starting p-type wafer, FIGURE 4A, is oxidized, to form an oxide coating over its entire surface, FIGURE 4B. The wafer is masked by employing an acid resist and the oxide layer at the lower surface is removed by etching, FIGURE 4C. A predeposition and diffusion step forms the lower p-type layer at the exposed face, FIGURE 4D. During the diffusion process, a new oxide layer is formed on the lower face. The original oxide layer is selectively removed, by masking and etching, from the other face as indicated, FIGURE 4E, leaving a plurality of windows. The wafer is then subjected to another predeposition and diffusion operation to diffuse into the wafer the n-type inset regions, FIGURE 4F. The oxide layer formed during this diffusion operation is then removed from the entire upper surface. The lower oxide layer is also selectively removed, FIGURE 4G. Again, the oxide may be selectively removed by suitably masking and etching. The wafer is subjected to a predeposition and diffusion which serves to form the lower n-type inset stripes and the upper n-type region as illustrated, FIGURE 4H.

All the oxide is then removed from the top surface, FIGURE 4I, and an additional p-type predeposition and diffusion performed to form the upper p+ layer, FIGURE 4J. The oxide is then removed, the wafer diced and ohmic contacts applied to the two surfaces, FIGURE 4K.

Thus, there is provided an improved four layer "guard ring" semiconductor switching device. The sum of the two alpha's is greater for the inner region than the outer region to further assure that switching takes place at the inner region. The device also includes means for making the device switch in response to current rather than to voltage whereby a plurality of devices may be connected in series to form a high voltage switching circuit.

Although a device having a particular arrangement of conductivity types for the various regions has been described, the invention is not intended to be limited in this respect as the invention is applicable to an opposite arrangement of conductivity type. The device described is preferably made of silicon semiconductor material but the invention is not to be limited in this respect since it is equally applicable to other semiconductor materials.

I claim:

1. A semiconductor switching device having first and second spaced faces comprising a first region of semiconductor material of one conductivity type, one surface of said region forming a first face of the device, a second region of semiconductor material of opposite conductivity type contiguous with said first region and forming therewith a first rectifying junction, said second region having an outer portion which completely surrounds a thinner inner portion, a third region of semiconductor material of said one conductivity type contiguous with the second region and forming therewith a second rectifying junction, said junction having an inner portion contiguous with said thinner inner portion which has a relatively high concentration of unbalanced chemical charges on at least one side of the junction and a surrounding outer portion contiguous with said outer portion which has a low concentration of unbalanced chemical charges on said side of the junction, the latter portion of said junction extending to the surface of the device, said third region having portions extending to the second face of the device, a distributed fourth region of semiconductor material of said opposite conductivity type comprising a plurality of regions inset into the third region to form therewith a distributed third junction, said plurality of regions having a width in at least one dimension equal to or smaller than the lateral spreading distance of minority carriers through the third region, said fourth region defining together with the third region the second face of said device, and an ohmic connection made to the second face of the device thereby to make ohmic connection to the portions of the third and fourth regions extending to said face, and an ohmic connection to the first region.

2. A semiconductor switching device as in claim 1 wherein said distributed fourth region comprises a plurality of bars inset into the third region to define with the third region said common surface.

3. A semiconductor switching device as in claim 2 wherein said inset bars form a grid to provide a plurality of plugs of said third region extending to the surface.

References Cited by the Examiner

UNITED STATES PATENTS

| | | | |
|---|---|---|---|
| 2,937,114 | 5/1960 | Shockley | 317—235 |
| 2,959,504 | 11/1960 | Ross et al. | 317—235 |
| 2,971,139 | 2/1961 | Noyce | 317—235 |
| 3,099,591 | 7/1963 | Shockley | 317—235 |
| 3,119,947 | 1/1964 | Goetzberger | 317—235 |
| 3,140,438 | 7/1964 | Shockley et al. | 317—235 |

FOREIGN PATENTS

| | | |
|---|---|---|
| 969,592 | 9/1964 | Great Britain. |
| 1,156,510 | 11/1963 | Germany. |

JOHN W. HUCKERT, *Primary Examiner.*

J. D. CRAIG, *Assistant Examiner.*